United States Patent [19]
Andrews et al.

[11] 4,258,323
[45] Mar. 24, 1981

[54] CATHODIC SURVEY APPARATUS

[75] Inventors: Larry A. Andrews, Tonganoxie, Kans.; Thomas N. Tietze, Kansas City, Mo.

[73] Assignee: Panhandle Eastern Pipe Line Company, Kansas City, Mo.

[21] Appl. No.: 63,118

[22] Filed: Aug. 2, 1979

[51] Int. Cl.³ ............................................. G01R 11/30
[52] U.S. Cl. .................................... 324/348; 324/52; 324/326
[58] Field of Search ...................... 324/326, 54, 66, 52, 324/65 P, 67, 62, 347, 348

[56] References Cited

U.S. PATENT DOCUMENTS

| | | | |
|---|---|---|---|
| 2,123,545 | 7/1938 | Pearson | 175/183 |
| 2,335,024 | 11/1943 | Pearson | 175/183 |
| 2,382,743 | 8/1945 | Penther et al. | 175/183 |
| 2,501,598 | 3/1950 | Eltenton et al. | 175/183 |
| 3,066,256 | 11/1962 | Rasor | 324/54 |
| 3,617,865 | 11/1971 | Hakata | 324/3 |
| 3,648,282 | 3/1972 | Kelly | 340/421 |
| 3,735,249 | 5/1973 | Stoll | 324/348 |
| 3,907,136 | 9/1975 | Christides et al. | 214/138 R |
| 3,916,298 | 10/1975 | Ulrich | 324/3 |
| 3,991,363 | 11/1976 | Lathrop | 324/52 |
| 4,039,938 | 8/1977 | Link | 324/52 |
| 4,063,161 | 12/1977 | Pardis | 324/52 |

*Primary Examiner*—David K. Moore
*Attorney, Agent, or Firm*—Fishburn, Gold and Litman

[57] ABSTRACT

An apparatus for locating an electrical leakage fault path relative to a cathodically protected buried pipe utilizes a conductor wire having a first end connected to the pipe and a second end wound on a reel including a level winding and distance measuring mechanism and connected to electrical signal monitoring components. An electrode in an earth cutting blade is also connected to the monitoring components and is mounted to a drafting structure for moving the blade through the earth generally over the buried pipe a sufficient depth to continuously encounter and sense electrical current indicating a flow or break in the cathodic protection of the pipe. The drafting structure includes a hitch for connection to a suitable vehicle and a regulating mechanism for controlling the depth of the blade into the earth. The monitoring components collect, store, process and analyze data derived from the electrode with respect to the conductor wire to continuously determine the extent of cathodic protection of the pipe and location of faults if any.

15 Claims, 9 Drawing Figures

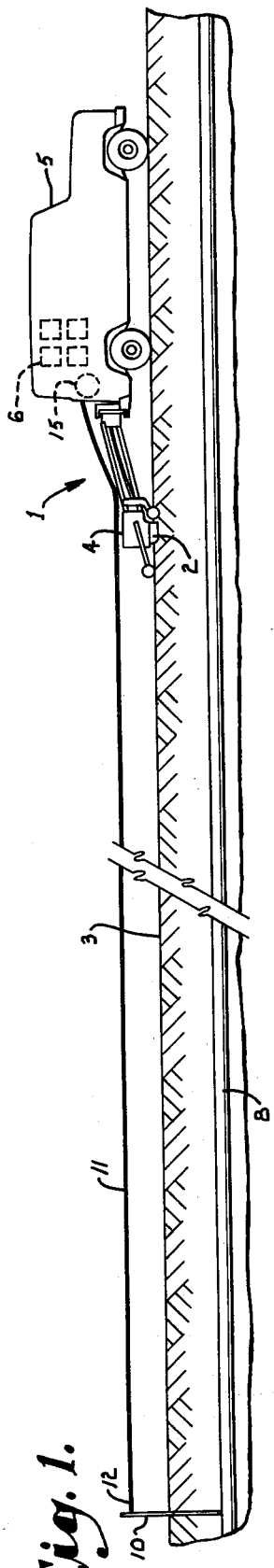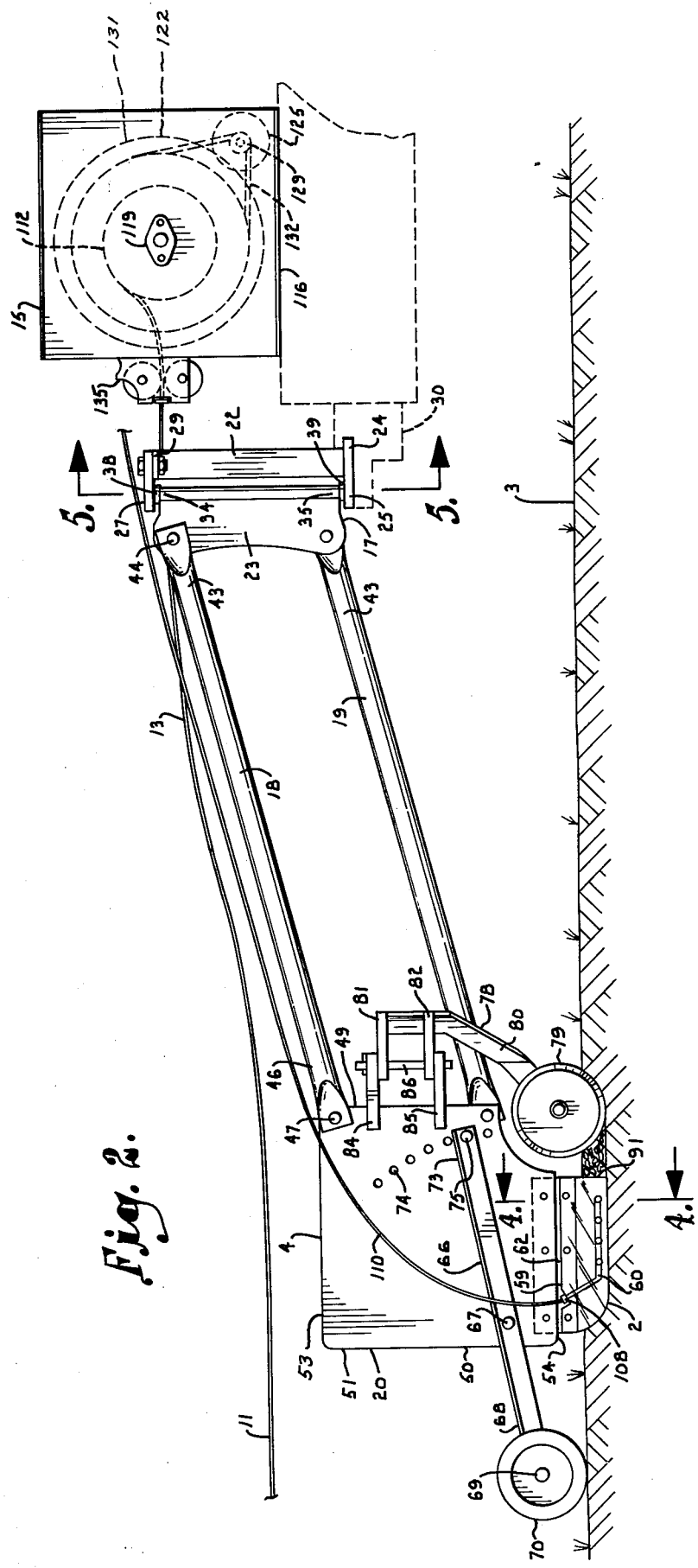

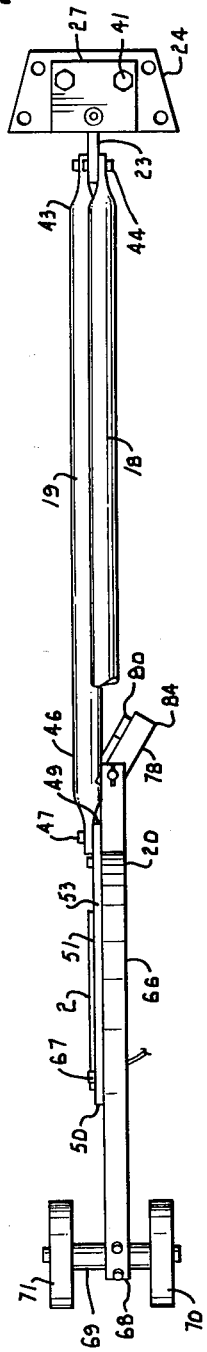
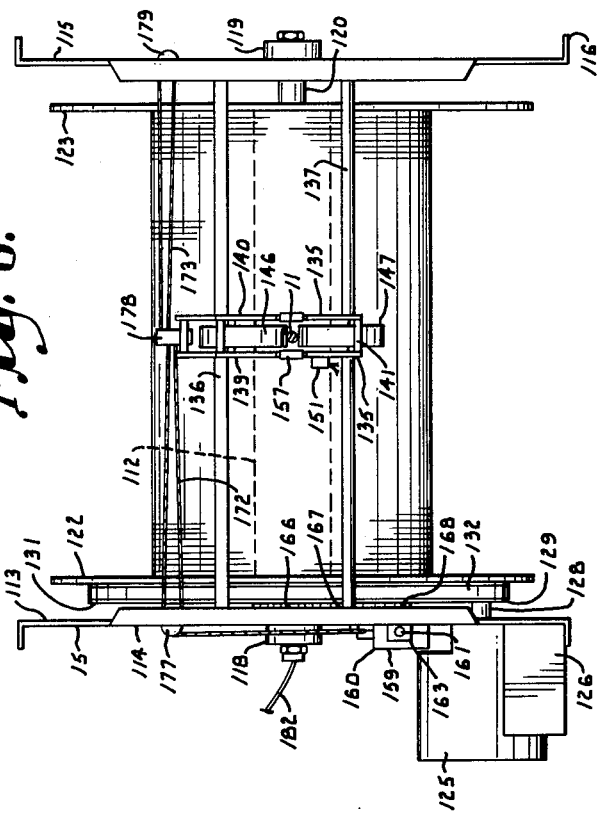
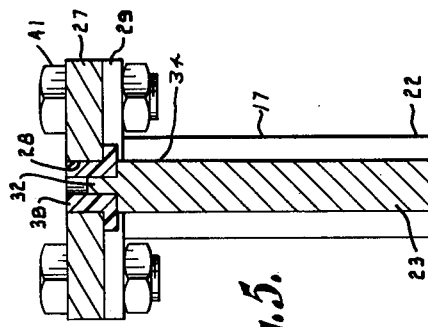
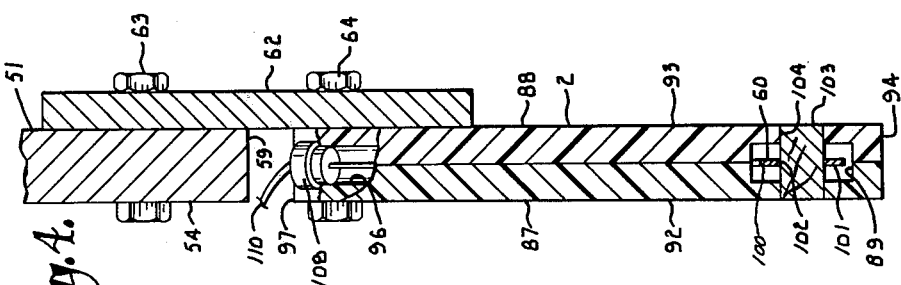

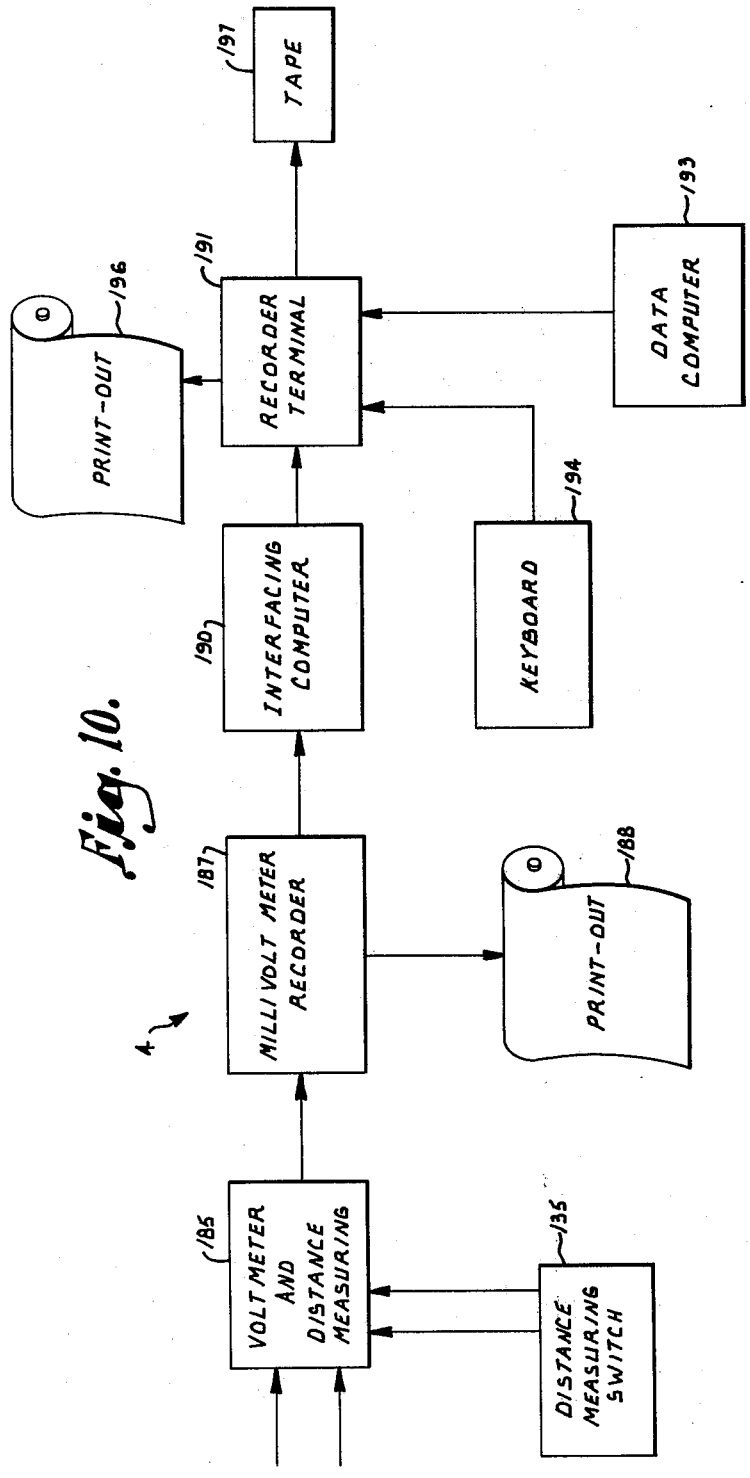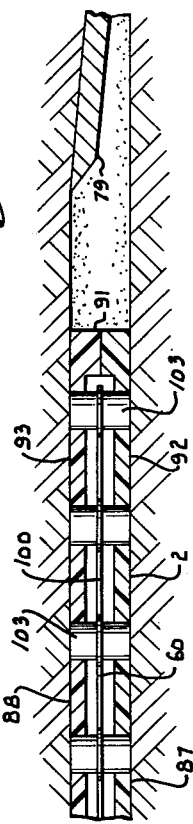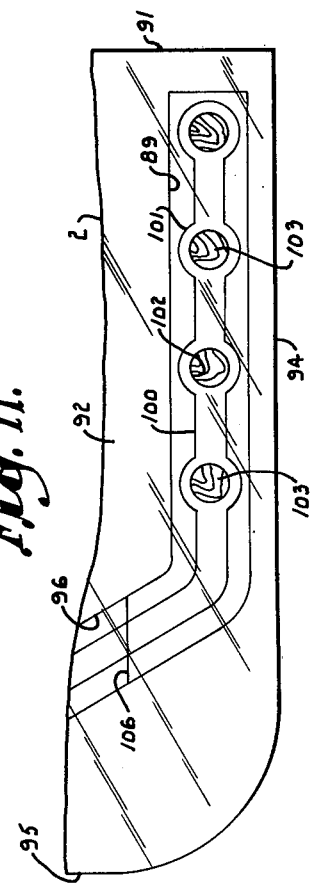

CATHODIC SURVEY APPARATUS

This invention relates to a method and apparatus for detecting electrolytic action associated with buried conductive structures and more particularly relates to detecting flaws in the cathodic protection of a buried pipeline.

Steel pipe employed to convey liquid petroleum products, natural gas, water and other fluids is subject to galvanic or electro-chemical corrosion which tends to cause a spot or area on the pipe to go into solution and corrode, leading to leaks and breakages in the pipeline. The industry practice and federal regulations call for cathodic protection of such pipes in which, by the application of an external source of D-C voltage, the pipe becomes lower in potential than the surrounding soil. The buried pipe is thus made a cathode instead of an anode and so long as the cathodic protection is effective, the pipe is prevented from corrosion.

Pipes, when used for transmission of natural gas, are typically buried 36 to 96 inches below the earth surface and have a coating of a protective insulating substance such as coal tar enamel, bonded epoxy or the like and may be suitably wrapped to protect the pipe against corrosion. The coating on the pipe is not a perfect insulator and the protective D-C energy can be measured above the pipeline. Utilizing a voltmeter connected between a conductor wire extending from a point on the pipeline and a conductor wire from an electrode in contact with the soil above the pipeline, a determination of the extent of cathodic protection can be made whereby a constant high reading on the voltmeter indicates that the protective energy is properly insulated from the ground by the protective coating on the pipeline.

Conversely, where the electrode encounters an electrical leakage fault path, low voltages are sensed by the voltmeter and indicate places where the D-C energy is effecting the potential of the surrounding soil, such as by a break in the protective coating on the pipeline, so that the meter indicates little potential difference between a high energy point at the connection of the conductor wire connected to the pipeline and the high energy point of the soil effected by the electrical leakage fault path.

Cathodic protection determination surveys have usually been conducted at intervals or spaced points along the length of the buried pipeline by a person walking the line. This method is time-consuming, expensive and subject to inaccuracies, not the least of which are missed faults if the fault is between survey points.

In view of the above, the principal objects of the present invention are: to provide an improved cathodic survey apparatus for locating an electrical leakage fault path in a buried conductive structure; to provide an improved cathodic protection testing apparatus that utilizes a motor vehicle for moving along the ground over a buried pipeline; to provide such an improved cathodic protection testing apparatus that eliminates the difficulties and inaccuracies of interval or point surveys; to provide a cathodic survey apparatus which measures voltages from an electrode in contact with the ground with respect to a point in physical contact with a buried pipeline; to provide an electrode which travels below an earth surface a sufficient depth to sense electrical flow in the earth; to provide such an electrode positioned within an earth-cutting blade having a relatively narrow leading edge; to provide a mounting structure for the earth-cutting blade which is adjustable to select a depth of the blade in the earth; to provide an improved reel for use with the mounting structure having level winding and distance measuring functions for a conductor wire connected to the pipeline; to provide a monitoring means permitting data derived from the electrode to be collected, stored, processed and analyzed; and to provide a cathodic survey apparatus which is relatively inexpensive, highly reliable in use and well adapted for its intended purpose.

Other objects and advantages of this invention will become apparent from the following description taken in connection with the accompanying drawings wherein are set forth by way of illustration and example, certain embodiments of this invention.

FIG. 1 is a diagramatic, elevational view illustrating a cathodic survey apparatus embodying the present invention and in use over a buried pipeline.

FIG. 2 is an enlarged, elevational view of an earth-cutting blade and drafting structure for moving the blade through the earth.

FIG. 3 is a fragmentary, top plan view of the earth-cutting blade and drafting structure.

FIG. 4 is a vertical sectional view of the earth-cutting blade taken along line 4—4, FIG. 2.

FIG. 5 is a vertical sectional view of a hitch connection of the drafting structure taken along line 5—5, FIG. 2.

FIG. 6 is a front elevational view of a reel for containing wire thereon and having level winding and distance measuring means.

FIG. 10 is a diagrammatic view of monitoring means for use with the earth-cutting blade and current sensing electrode and showing a plurality of components for collecting, storing, processing and analyzing data derived thereby.

FIG. 11 is an enlarged, fragmentary sectional view of the electrical current sensing electrode positioned within the earth-cutting blade.

FIG. 12 is an enlarged, fragmentary, transverse sectional view of the earth-cutting blade showing the electrical current sensing electrode thereof in contact with the soil as the blade is drawn therethrough.

Figure 8:
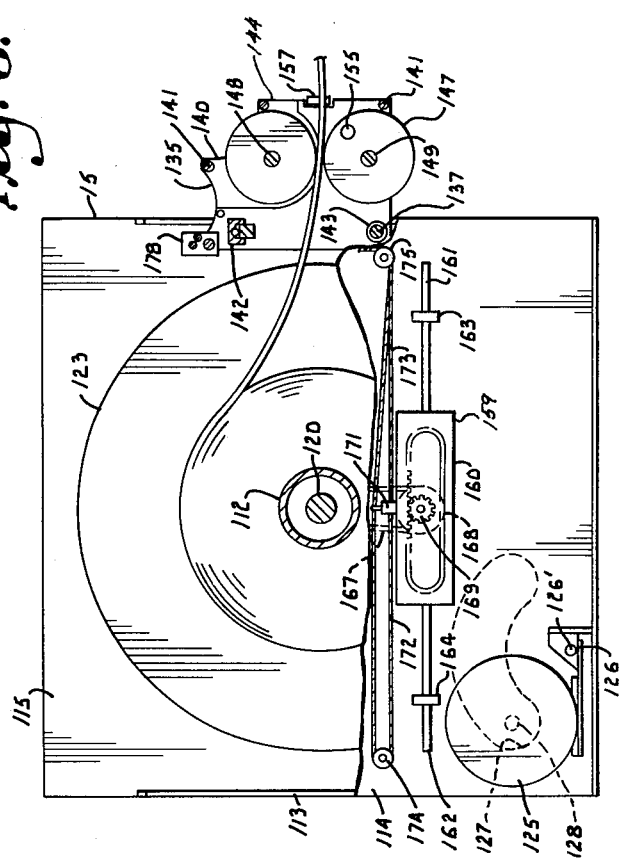
FIG. 8 is a fragmentary view of the wire winding reel and showing details thereof.

As required, detailed embodiments of the present invention are disclosed herein, however, it is to be understood that the disclosed embodiments are merely exemplary of the invention which may be embodied in various forms. Therefore, specific functional and structural details disclosed herein are not to be interpreted as limiting, but merely as a basis for the claims and as a representative basis for teaching one skilled in the art to variously employ the present invention in virtually any appropriately detailed structure.

Referring more in detail to the drawings:

The reference numeral 1 generally indicates a cathodic apparatus embodying the present invention and including an earth-cutting blade 2 having means for sensing electric energy in the earth 3. The earth-cutting blade 2 is mounted to suitable structure such as a drafting apparatus 4 connected to a vehicle 5 such as a tractor or truck for moving the blade 2 through the earth 3. Monitoring means 6 are included for determining electrical voltages and measurements thereof and collecting, storing, plotting and analyzing said measurements.

FIG. 1 illustrates an example of the use of the survey apparatus to measure, or determine the extent of cathodic protection of a buried conductive structure, such as a pipeline 8 having a protective covering of coal tar enamel, bonded epoxy or the like and which may be suitably wrapped. The pipeline 8 is provided with a source of D-C energy (not shown) and is cathodically protected against detrimental electrolytic action leading to corrosion.

Located at intervals along the pipeline 8 are a plurality of station markers 10 respectively comprising an insulated probe physically contacting the pipeline 8 and extending above ground level. In pipeline practice, station markers 10 are positioned at known intervals and selected locations and visually reveal the presence of the pipeline 8 therebelow.

A conductor wire 11 has a first end 12 connected to the station marker 10 for maintaining direct electrical contact with the cathodically protected pipeline 8. A wire second end 13 is wound on a reel 15 as described below and electrically connected to an electrode in the earth-cutting blade 2 via the monitoring means 6 for comparison of electrical signals sensed respectively by the electrode and the conductor wire 11. The wire is preferably properly shielded, such as with plastic insulation, to prevent inadvertent grounding and has an outside diameter, with insulation, in the order of $\frac{1}{8}$th inch.

As shown in FIGS. 1 and 2, the vehicle 5 tows a drafting apparatus 4 comprising a hitch portion 17, elongate upper and lower arms 18 and 19 and a depth regulating mechanism 20 controlling the depth of the earth-cutting blade 2. The hitch portion 17 has vertically extending fixed and pivotal upright members 22 and 23 in spaced, side-by-side relationship, the fixed upright member 22 being mounted to the vehicle 5 and the pivotal upright member 23 being rotatably connected to the fixed upright member 22. In the illustrated example, FIG. 5, the fixed upright member 22 has a bottom flange or foot 24 mounted to a connecting portion 30 of the vehicle 5 with a lower ear portion 25 of the bottom flange or foot 24 having a bore 26 therethrough for connecting the pivotal upright member 23. An upper ear 27 has a bore 28 vertically aligned with the lower bore 26 and is connected, as by bolts 41, to a flange 29 mounted normally atop the fixed upright member 22.

The pivotal upright member 23 is, for example generally planar in shape and has respective upper and lower ends 34 and 35 with upper and lower pins 32 and 33 extending longitudinally therefrom, FIG. 5. Insulated bushings 38 and 39 respectively fit over the pins 32 and 33 and provide electrical isolation of the pivotal upright member 23 from the fixed upright member 22 to prevent interference from the engine, radio, alternator, and the like of the vehicle 5.

To connect the pivotal upright member 23 to the fixed upright member 22, the lower pin 33 is inserted into the insulated bushing 39 and fitted into the bore 26 of the lower ear portion 25. The upper pin 32 is inserted into the insulated bushing 38 and fitted into the bore 23 of the upper ear 27. The upper ear 27 is then attached to the fixed upright member 22 by the bolts 41 to bring the pivotal upright member 23 into parallel and rotative engagement with the fixed upright member 22.

The upper and lower arms 18 and 19, FIG. 2, form drawbars which respectively have first ends 43 pivotally connected for up and down swinging movement to respective upper and lower ends 34 and 35 of the pivotal upright member 23 by pins 44. Arm second ends 46 are similarly pivotally connected to the blade mounting and depth regulating mechanism 20 by pins 47 to a front portion 49 of the mechanism 20 whereby the arms 18 and 19 form lengths of a parallelogram-shaped structure for providing parallel motion of the earth-cutting blade 2 to the earth 3 at various elevations or depths.

The depth regulating mechanism 20 includes a body member 51 having front and rear portions 49 and 50 and upper and lower portions 53 and 54. The earth-cutting blade 2 is mounted to the body member 51 adjacent the lower portion 54, FIGS. 2 and 4, by a connecting plate 62 extending parallel to the body member 51 and secured to the lower portion 54 and the blade 2 by upper and lower fasteners such as bolts 63 and 64. A space 59 is retained between the lower portion 54 and the blade 2 for access to an electrode 60 in the blade 2.

To adjust the depth of cut of the blade 2 into the earth 3, an elongate arm 66 is pivotally connected by a pin 67 to the body member 51 adjacent the rear portion 50. A first end 68 of the arm 66 has a shaft or axle 69 extended normally therethrough to which spaced wheels 70 and 71 are rotatably mounted for travel over the earth surface. An arm second end 73 is seletively connectable, as by a pin 75, with one of a series of bores 74 through the body member 51 positioned equidistantly and radially of the pin 67 for up and down swinging movement of the arm 66 and selective positioning thereof at angles to the body member 51 for moving the wheels 70 and 71 up and down and regulating the depth of cut. In the higher positions, the blade 2 is moved out of ground contact for crossing roads, bridges and the like. Preferably, the earth-cutting blade 2 is set to extend approximately 2 to 6 inches below the earth surface for encountering electric currents in the ground between the pipeline and the earth and for adequate sensitivity thereto.

A coulter assembly 78, FIG. 2 is mounted forwardly of the earth-cutting blade 2 to cut a channel for the blade 2 and slice through interferring vegetation in a line of travel of the blade 2. The exemplary coulter assembly 78 includes a disc 79 rotatably mounted on an arm 80 affixed for sideward swinging movement to the front portion 49 of the body member 51. Spaced, upper and lower ears 81 and 82 extend from the arm 80 and interengage with spaced, upper and lower ears 84 and 85 extending from the body member 51. A pin 86 extends through the aligned ears 81, 84 and 82, 85 and thereby connects the coulter assembly 78 to the body member 51 for pivotal movement. Preferably, the arm 80 is curved laterally to provide clearance from the lower arm 19 during movement of the coulter assembly 78 about the axis pin 86.

For smoothly parting the earth, the blade 2 is preferably planar in shape and has a relatively narrow leading edge 91, bottom and top edges 94 and 97 and a rear or trailing edge 97. For accommodating the electrode 60 in the illustrated example, the blade 2 is formed of side-by-side sheets 87 and 88 of a non-conductive, relatively long wearing material such as Plexiglas, Lexan or the like substance resistant to abrasion, side loads and other stresses encountered while plowing through the earth. It is within the concept of this invention that the electrode 60 can be emplaced within the blade 2 by various methods such as molding a solid blade with a channel retained therein, providing a separate lip portion or the like and in the illustrated example, an elongate channel 89 is formed in and between the sheets 87 and 88 and extends within the blade 2 substantially the length of the bottom edge 94 and spaced slightly upwardly therefrom from adjacent the leading edge 91 and upwardly to an opening 96 in the top edge 97.

In the illustrated example, the electrode 60 includes a strip 100 preferably of a highly conductive metal such as copper having a plurality of ring portions 101 with bores 102 therethrough. Plugs 103 preferably composed of a porous and permeable material such as wood or suitable ceramics extend through the bores 102 for purposes described below. Bores 104 extend transversely through the blade 2 and in coaxial alignment with the bores 102 for insertion of the plugs 103 completely through the blade 2 and the strip 100 whereby the plugs 103 physically contact the strip 100 and the earth 3 as the blade 2 passes therethrough and so that the plugs 103 provide ultra-sensitive sensing portions of the electrode 60.

To provide a reference electrode standard in the industry for measuring cathodic protection potentials, a conductive liquid such as an aqueous solution of copper sulfate is poured into the channel 89 through the opening 96 and surrounds the copper strip 100, the channel 89 thereby acting as a reservoir. The plugs 103 become saturated, or wetted, with the copper sulfate solution 106 whereby an electrically conductive path of low resistance is formed from the soil contacting the blade 2 and plugs 103 to the copper strip 100. As the blade 2 moves through the earth 3, the copper sulfate solution 106 gradually seeps continuously from the reservoir through the plugs 103 and must be replenished as necessary through a removable cap 108 selectively closing the end of the opening 96 and making contact with the electrode strip 100. A conductive and shielded wire 110 extends from the cap 108 in electrical contact with the strip 100 to the monitoring means 6 for transmission of electrical signals sensed by the electrode 60.

Figure 7:
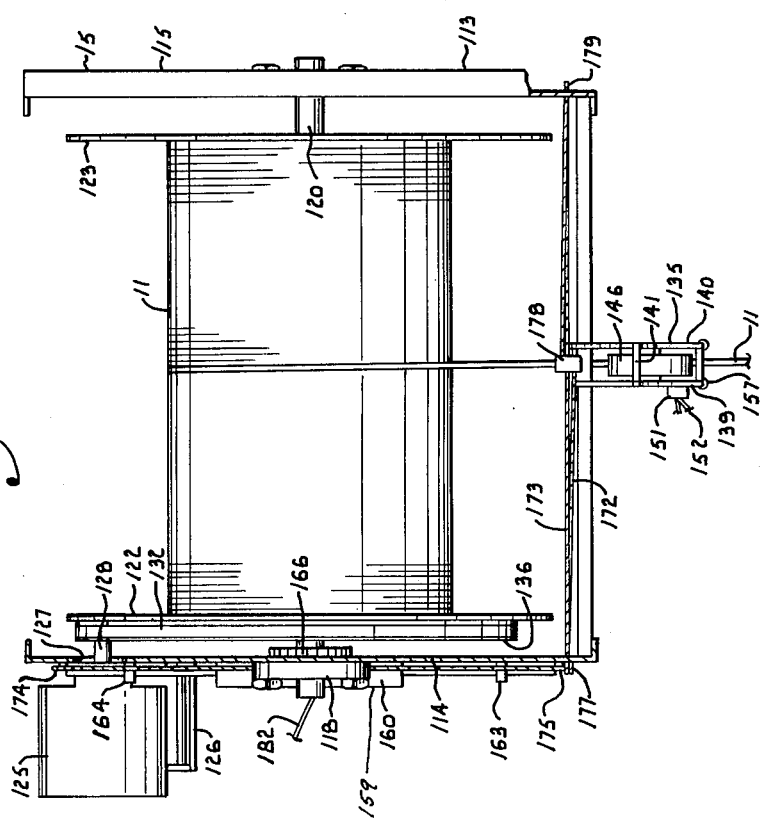
FIG. 7 is a top plan view of the wire reel and showing the level winding and distance measuring members thereof.

The reel 15, FIG. 6–8, includes a drum 112 for winding the conductor wire 11 thereon and having a horizontal axis of rotation. The drum 112 is mounted within a frame structure 113 having opposite vertical side plates 114 and 115 respectively with flanges 116 on lower portions thereof for mounting on the vehicle 5. Spaced coaxial journals 118 and 119 in the side plates 118 and 119 rotatably support a drum axle shaft 120. Opposite ends of the drum 112 are connected to circular flanges 122 and 123 for retaining the conductor wire 11 thereon.

The reel 15 includes means for selectively providing powered rotation of the drum 112 such as an electric motor 125 swingably mounted to the side plate 114 by a hinged bracket 126 having an axle 126' spaced from the electric motor 125 for up and down swinging movement of the motor 125 and whereby the motor 125 tends to swing downwardly and away from the drum 112 under the force of gravity. A drive shaft 128, FIG. 7, extends from the motor 125 through a relatively large opening 127 in the side plate 114 for swinging movement with the motor 125. A first pulley 129 is secured to the end of the drive shaft 128 and positioned between the side plate 114 and the drum flange 122. A second pulley 131, such as of larger diameter than the first pulley 129 for a desired drive multiplication, is mounted to the circular flange 122 for revolution therewith. A drive belt 132 connects the first and second pulleys 129 and 131 and is maintained under driving tension by the weight of the motor 125 on the hinged bracket 126 for selectively providing powered rotation of the drum 112, as when it is desired to reel in the conductor wire 11.

Figure 9:
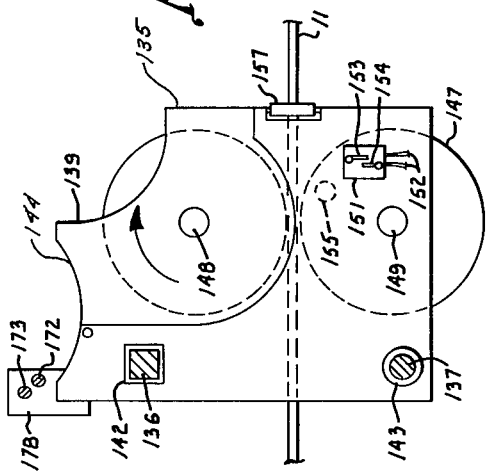
FIG. 9 is an enlarged, fragmentary view of a distance measuring mechanism of the wire winding reel.

A level winding and distance measuring mechanism 135, FIGS. 8 and 9, is mounted forwardly of the reel 15 on horizontal upper and lower bars 136 and 137 extending between the side plates 114 and 115 for longitudinal sliding movement across the drum 112. The mechanism 135 includes a frame of horizontally spaced, vertically extending walls 139 and 140 secured together by transverse connecting rods 141. An upper ball bearing journal 142 and lower sleeve bearing 143 provide connections for slidably attaching the mechanism 135 to the upper and lower bars 136 and 137.

Upper and lower wheels 146 and 147 are mounted between the walls 139 and 140 by respective axle pins 148 and 149 for rotation in a vertical plane with the upper wheel 146 mounted in a separate hinged portion 144 of the walls 139 and 140 for access between the wheels 146 and 147. The upper wheel 146 bears upon the conductor wire 11 and the lower wheel 147 so that the lower wheel 147 rotates in response to reeling and unreeling movement of the conductor wire 11.

The distance measuring means includes a switch 151 with electrical leads 152 for transmitting a signal to the monitoring means 6 when the switch 151 closes and completes a circuit. The switch 151, FIG. 9, is mounted over an aperture (not shown) in the wall 139 and includes a movable arm 153 which contacts a stationary arm 154 in response to the attraction of a magnet 155 mounted on the lower wheel 147 to complete a circuit. The known circumference of the lower wheel 147 thereby provides a measurement of the length of wire 11 passing between the wheels 146 and 147.

Roller bearings 157 are respectively mounted on front edges of the walls 139 and 140 and facilitate paying out and winding in of the conductor wire 11 as the level winding and distance measuring mechanism 135 moves across the drum 112.

A level winding drive mechanism 159, in the illustrated example, includes a gear 160 in the form of an elongate housing preferably of a length commensurate with the length of the drum 112 and having internal teeth. The gear 160 is reciprocally mounted on the side plate 114 for front to rear movement by longitudinally extending guide rods 161 and 162 slidably mounted in front and rear ears 163 and 164 projecting from the side plate 114. To cause the gear 160 to move back and forth, a first sprocket 166 is fitted onto the axle shaft 120 and connected, such as by a drive chain 167, to a second sprocket 168. A pinion gear 169 is axially connected to the second sprocket 168 and drives the gear 160 therearound in intermeshing engagement. As the pinion gear 169 rotates, the gear 160 reciprocates back and forth on the side plate 114 and, via an arrangement of cables and pulleys, moves the level winding and distance measuring mechanism 135 from side to side.

The exemplary arrangement, FIG. 8, includes a connection block 171 affixed atop the gear 160 with first ends of cables 172 and 173 attached thereto. The cable 172 travels around a pulley 174 positioned on a rearward portion of the side plate 114 and the cable 173 around a pulley 175 on a forward portion of the side plate 114. The cable 172 leads from the pulley 174 also around the cable 175 and the cables 172 and 173 run upwardly together and around a third pulley 177, FIG. 6. From the third pulley 177, the cable 172 is connected to a block 178 on the level winding and distance measuring mechanism 135. The cable 173 extends beyond the mechanism 135, around a pulley 179 mounted on the opposite side plate 115 and back to the block 178. Thus, rotation of the pinion gear 169 causes the gear 160 to reciprocate back and forth and pull the cables 172 and 173 therewith, in turn pulling the level winding and distance measuring mechanism 135 for travel from side to side of the drum 112 and level winding of the conductor wire 11.

The conductor wire 11 is electrically connected to the drum 112 and electrical signals directly from the cathodically protected pipeline 8 via the connector wire 11 are transmitted to the monitoring means 4 by a wire 182 swivelably connected to the drum axle shaft 120 so that the wire 182 is not twisted as the drum 112 revolves. Signals from the electrode 60 are transmitted to the monitoring means 4 via the wire 110 and signals from the distance measuring switch 151 are transmitted via the electrical wires 152.

The monitoring means 4 may include a variety of electrical measuring instruments and computing devices and in the illustrated example, FIG. 10, signals received from the electrode 60 and from the pipeline are entered into a high sensitivity voltmeter 185 having a distance referencing device therewith receiving signals from the distance measuring switch 185. Measurements by the distance measuring switch 135 can be compared to known positions of station markers 10 to determine location of the electrode 60 which are in turn referenced against signals received from the electrode 60. From the voltmeter and distance referencing device 185, data are entered into a millivoltmeter recorder 185 having a print-out device 188 therewith providing a printed record of impulses received. From the millivoltmeter recorder 187, data are entered into an interfacing computer 190, which for example, changes the data readings from analog to digital form and routed to a recorder terminal 191 which, using a data computer 193 in conjunction with entries made on a keyboard 194, such as indications of weather, rivers, fences, dates and other pertinent data which may effect the signal readings, provides both a paper print-out 196 and a magnetic tape record 197.

In the use of the cathodic survey apparatus 1, the hitch portion 17 of the drafting apparatus 4 is connected to a suitable vehicle 5 and positioned generally adjacent a station marker 10 of known location and over the buried pipeline 8. The conductor wire 11 is electrically connected to the pipeline 8, such as by attachment to the station marker 10.

The channel 89 is filled with the aqueous solution of copper sulfate 106 and the earth-cutting blade 2 is positioned so that the bottom edge 94 extends approximately 2 to 6 inches into the earth 3 for encountering a cathodic protection circuit between the pipeline and the earth and sensing electrical current flow. The motor 125 is swung upwardly on the hinged bracket 126 and released from driving relation with so that the drum 112 freely pays out the conductor wire 11 through the level winding and distance measuring mechanism 135 as the vehicle 5 travels away from the station marker 10. Simultaneously, the earth-cutting blade 2 rips through the top layer of soil and plant roots below the ground surface and above the buried pipeline 8, thereby continuously sensing electrical signals relating to cathodic protection of the buried pipeline 8.

The coulter assembly 78 in front of the blade 2 slices through tangled plant roots and hardened earth and permits the blade 2 to slide through the earth therebehind without undue force being exerted on the blade 2.

As the earth-cutting blade 2 and the electrode 60 therein plow along the pipeline 8, the sensed electrical signals are constantly received by the monitoring means 6 whereby an operator inside the vehicle 5 can immediately identify some potential corrosion areas. Further, a record of the survey is made as described above so that the survey can be evaluated and compared with similar or previous surveys to determine long term degradation of cathodic protection tending to permit corrosion.

When approximately 2,000 to 3,000 feet of the conductor wire 11 has been unreeled from the drum 112, the conductor wire becomes increasingly subject to breakage and the wire 11 should be reeled in and connected to another station marker. By swinging the motor 125 into driving tension, power is applied to the drum 112 to reel in the conductor wire 11. The wire 11 is connected to the new station marker and the survey recommenced.

It is to be understood that this invention can be embodied in many and varied forms and one, two or three or more earth-cutting blades 2 and electrodes 60 can be employed to take measurements directly over and even above and to a side of the pipe line 8. Therefore, while one form of this invention has been illustrated and described, it is not to be limited to the specific form or arrangement of parts herein described and shown, except insofar as such limitations are included in the following claims.

What is claimed and desired to secure by Letters Patent is:

1. An apparatus for drafting by a vehicle for sensing and locating electric current leakage faults in a cathodically protected pipeline buried below an earth surface and comprising:
   (a) a conductor wire electrically connected to a buried pipeline;
   (b) a drafting structure having means for connection to a drafting vehicle;
   (c) an earth cutting blade connected to said drafting structure and extending generally downwardly therefrom, said cutting blade being adapted for plowing through and traveling below an earth surface generally adjacent said pipeline and having a bottom portion for positioning by said drafting structure at a sufficient depth to continuously encounter an electric current and any electric current leaking faults between the earth and said pipeline as said drafting structure moves therealong; said drafting structure including arm means forming an arrangement for maintaining said blade at a preselected constant depth with respect to the earth;
   (d) an electrode in said blade bottom portion for sensing said electric current and said electric current leakage faults; and
   (e) means for monitoring said electric current between said conductor wire and said electrode for locating cathodic protection faults.

2. The apparatus set forth in claim 1 wherein:
   (a) said blade has top and bottom portions, a relatively narrow leading edge and opposite sides extending rearwardly therefrom and terminating downwardly at said bottom portion;

(b) said blade includes an interior passage extending downwardly from said top portion into said blade and terminating near said bottom portion; and (c) said electrode is positioned in said passage.

3. The apparatus set forth in claim 2 wherein:

(a) said electrode includes a conductive metal member in said blade;

(b) said electrode includes at least one plug member of porous material extending through said blade and contacting said metal member and the earth below the earth surface; and (c) an electrically conductive liquid wetting said plug member for providing a conductive path between said metal member and said earth.

4. The apparatus set forth in claim 3 wherein:

(a) said passage extends within said blade along said bottom portion and has an outlet on a top portion of said blade; including (b) a removable and replaceable cap on said outlet for filling said passage as a reservoir with said conductive liquid; and (c) a wire extending from said means for monitoring and connected to said cap and said metal member for transmitting said electric currents.

5. The apparatus set forth in claim 4 wherein:

(a) said metal member is a copper strip; and (b) said conductive liquid is an aqueous solution of copper sulfate.

6. The apparatus set forth in claim 1 wherein:

(a) said drafting structure includes a hitch portion electrically insulated from said vehicle;

(b) a body member mounted to said blade; and wherein said area means, includes (c) upper and lower draw arms of substantially equal length extending between said hitch portion and said body member and forming a parallelogram shaped structure providing parallel motion of said blade at various elevations and depths.

7. The apparatus set forth in claim 6 including:

(a) an elongate arm pivotally connected to said body member for vertical swinging movement and having a rear end extending rearwardly of said body member;

(b) means for selectively fastening said arm to said body member at a selected one of a plurality of angles thereto;

(c) an earth contacting wheel rotatably connected to said arm rear end for maintaining said blade at selected elevations and depths.

8. The apparatus set forth in claim 7 including:

(a) a coulter assembly mounted to said body member forwardly of said blade and having a disc for slicing through vegetation and deflecting articles from a path of travel of said blade.

9. The apparatus set forth in claim 1 including:

(a) a reel for winding and unwinding said conductor wire and having a distance measuring means for determining an amount of conductor wire unreeled therefrom;

(b) said distance measuring means includes a wheel contacting said conductor wire and rotatable as said conductor wire is payed out from said reel;

(c) a magnet mounted on said wheel and rotatable therewith; and (d) a magnetically actuated switch mounted adjacent said wheel and opening and closing in response to said magnet passing thereby as said wheel rotates for signaling a revolution of said wheel.

10. The apparatus set forth in claim 1 including:

(a) a reel for winding and unwinding said conductor wire and having a level winding means thereon for evenly spooling said conductor wire thereon;

(b) said level winding means includes;

(1) a guide for said conductor wire;

(2) a gear mechanism driven by said reel;

(3) a cable and pulley arrangement operably connected to said gear mechanism and said guide for moving said guide across said reel and leading said conductor wire on said reel.

11. An apparatus for sensing and locating an electrical current leakage fault path in a cathodically protected pipeline buried in the ground and comprising:

(a) a conductor wire having a first end electrically connected to a pipeline for sensing electrical current therein;

(b) a reel for winding and unwinding said conductor wire and having support members for mounting said reel on a vehicle;

(c) distance measuring means and level winding means for said conductor wire connected to said reel and movable thereacross;

(d) a drafting structure for towing behind the vehicle and having a hitch portion electrically insulated from the vehicle, a body member, upper and lower draw arms of substantially equal length extending between said hitch portion and said body member and forming a parallelogram shaped structure for keeping said body member at a constant attitude relative to the ground, and a height regulating mechanism for said body member including an elongate arm swingably connected to said body member for vertical swinging movement and having a rear end extending rearwardly of said body member, a fastener selectively securing said elongate arm to said body member for projection of said elongate arm at a selected angle therefrom, and a ground engaging wheel rotatably connected to said elongate arm rear end and maintaining said body member at a selected height above the ground;

(e) an earth cutting blade adapted for plowing through said blade being secured to said body member and adjustable in height and depth therewith for travel below a ground surface a sufficient depth to encounter an electrical leakage fault path;

(f) an electrode positioned in a passage in said blade and having a conductive metal member and a plurality of porous plugs extending generally transversely through said blade and physically contacting said metal member, said electrode having an electrically conductive liquid wetting said plugs and providing a path of low resistivity from the ground to said metal member for sensing the electrical current leakage fault path;

(g) a coulter assembly mounted to said body member and having a disc positioned forwardly of said blade for slicing through vegetation and deflecting articles from a path of travel of said blade; and (h) monitoring means electrically interposed between said electrode and said conductor wire and operable to collect, store, process and analyze data derived from said electrode with reference to an electrical current in said pipeline transmitted by said conductor wire for continuously determining the extent of cathodic protection of said pipeline and locating electrical current leakage fault paths therealong.

12. A method for continuously sensing and locating electric current leakage faults in a cathodically protected pipeline buried below an earth surface and comprising the steps of:
   (a) providing an earth cutting blade having an electrode at a bottom portion thereof and support means with said cutting blade mounted thereto in earth engaging relation;
   (b) electrically connecting a first end of a conductor wire to a buried pipeline;
   (c) storing said conductor wire on a reel;
   (d) electrically connecting a second end of said conductor wire to a monitoring means;
   (e) electrically connecting said electrode to said monitoring means;
   (f) extending said blade bottom portion and said electrode below the earth surface and traveling along said pipeline generally adjacent thereto at a sufficient depth to run below a top layer of soil and vegetation and continuously encounter an electric current and any electric current leakage faults between the earth and said pipeline; and
   (g) monitoring said electric surrent by comparison between current from said conductor wire and said electrode for locating cathodic protection faults.

13. The method set forth in claim 12 including the steps of:
   (a) unwinding said conductor wire on said reel as said support means carrying said blade and said electrode moves along said pipeline;
   (b) measuring the length of said conductor wire wound and unwound on said reel for determining distance from a point of connection of the first end of said conductor wire; and
   (c) evenly rewinding said conductor wire on said reel.

14. The method set forth in claim 13 including the steps of:
   (a) deriving signal strength and current direction data from said monitoring means; and
   (b) analyzing, storing and plotting said data for evaluating the extent of cathodic protection of said pipeline and the location and relative intensity of any cathodic protection faults therealong.

15. The method set forth in claim 14 including the steps of:
   (a) extending said blade below the earth surface so that said electrode is positioned about four to six inches below the earth surface.

* * * * *